(12) United States Patent
Iwase

(10) Patent No.: US 7,372,995 B2
(45) Date of Patent: May 13, 2008

(54) ANALYSIS APPARATUS

(75) Inventor: Hisanaga Iwase, Saitama (JP)

(73) Assignee: Pioneer Corporation, Tokyo (JP)

( * ) Notice: Subject to any disclaimer, the term of this patent is extended or adjusted under 35 U.S.C. 154(b) by 665 days.

(21) Appl. No.: 10/944,861

(22) Filed: Sep. 21, 2004

(65) Prior Publication Data

US 2005/0078870 A1    Apr. 14, 2005

(30) Foreign Application Priority Data

Sep. 25, 2003  (JP) ............................ P2003-334148

(51) Int. Cl.
*G06K 9/48*    (2006.01)
(52) U.S. Cl. ...................... 382/199; 382/203
(58) Field of Classification Search ................ 382/165, 382/190, 199, 203, 206, 224, 266
See application file for complete search history.

(56) References Cited

U.S. PATENT DOCUMENTS

| 4,183,013 | A | * | 1/1980 | Agrawala et al. ........... 382/173 |
| 4,771,469 | A | * | 9/1988 | Wittenburg ................. 382/203 |
| 5,154,795 | A | * | 10/1992 | Ishida et al. ................. 117/15 |
| 5,835,379 | A | * | 11/1998 | Nakano ...................... 700/197 |
| 5,946,220 | A | * | 8/1999 | Lemelson .................... 700/273 |
| 5,983,251 | A | * | 11/1999 | Martens et al. ............. 708/203 |
| 6,956,961 | B2 | * | 10/2005 | Cong et al. ................. 382/133 |
| 7,246,049 | B2 | * | 7/2007 | Nakanishi et al. ............. 703/8 |
| 2002/0183993 | A1 | * | 12/2002 | Hirata ........................... 703/2 |
| 2004/0049722 | A1 | * | 3/2004 | Matsushita .................. 714/724 |

FOREIGN PATENT DOCUMENTS

JP    2002-140653 A    5/2002

* cited by examiner

*Primary Examiner*—Daniel Mariam
(74) *Attorney, Agent, or Firm*—Sughrue Mion, PLLC

(57) ABSTRACT

An analysis apparatus includes an information acquisition part for acquiring shape information about an analysis target object, an additional information extraction part for extracting additional information on the analysis target object from the shape information, and an analysis condition decision part for determining at least one boundary conditions based on the additional information.

5 Claims, 7 Drawing Sheets

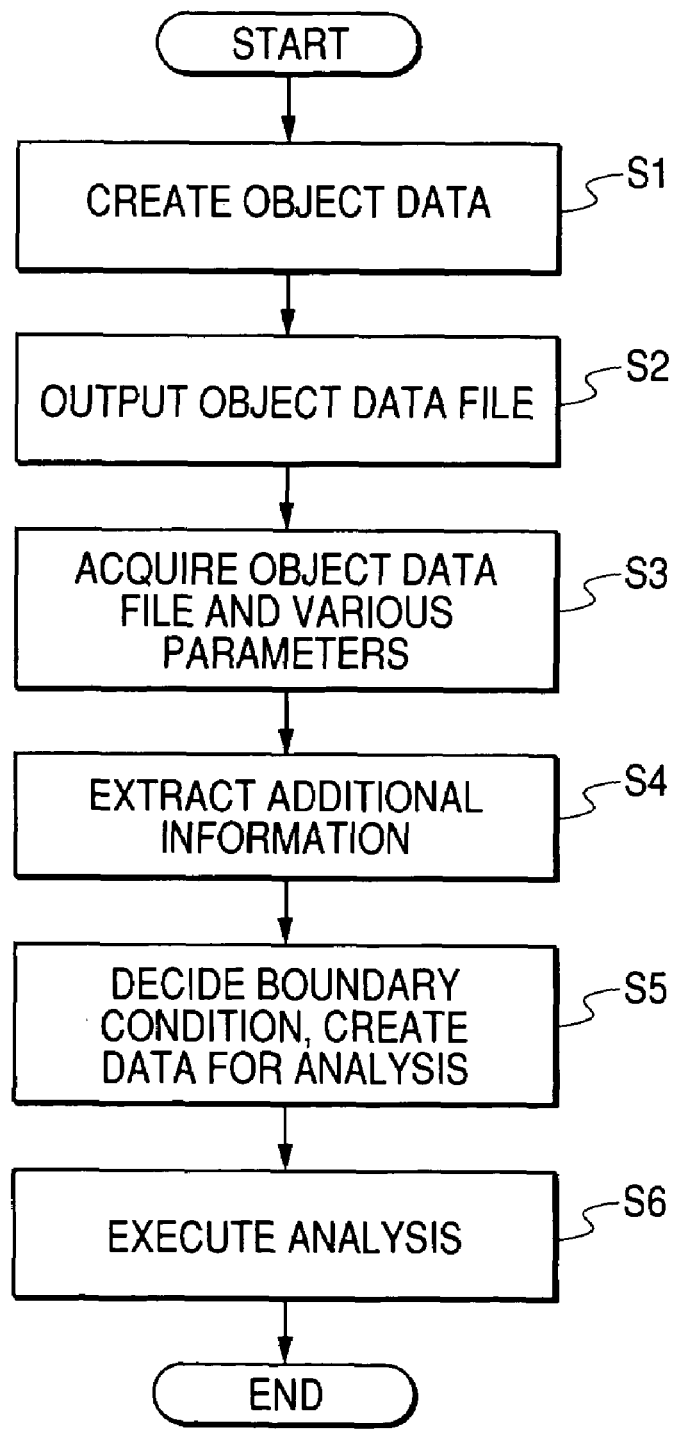

ANALYSIS APPARATUS

BACKGROUND OF THE INVENTION

1. Field of the Invention

The present invention relates to an analysis apparatus, an analysis method, an analysis program, and a computer readable record medium on which an analysis program is recorded.

2. Description of the Related Art

Generally, there are various development steps in a process of product development. For example, a CAE (Computer Aided Engineering) system is used in order to test various characteristics which a product has at a previous stage for producing a prototype of the product.

This CAE system is a system for supporting various processes of product development and, for example, by incorporating the CAE system into a computer and executing the CAE system, simulation etc. of a structural strength characteristic, a vibration characteristic, a heat-resistant characteristic, etc. of a part having a complicated shape can be performed. The CAE system is utilized in wide fields of industry in order to perform the product development for the purpose of cost cutting, quality improvement and reduction in development schedule.

As an apparatus related to this CAE, a simulation data creation apparatus in which in GUI (Graphical User Interface) environment, several desired models are selected from among plural basic object models generated by a modeling language and a boundary condition for simulation execution is given by operating these selected object models has been known. According to this simulation data creation apparatus, a user can create simulation data without understanding a complicated programming language, and it is easy for the user to handle (for example, JP-A-2002-140653).

SUMMARY OF THE INVENTION

In the simulation data creation apparatus described above, there is a problem that a boundary condition must be given in each case every plural object models selected normally and the number of man-hours of work of a user increases. Such a problem can be shown as one example of problems that the invention is to solve.

According to a first aspect of the invention, an analysis apparatus includes an information acquisition part for acquiring shape information about an analysis target object, an additional information extraction part for extracting additional information on the analysis target object from the shape information, an analysis condition decision part for determining at least one boundary conditions based on the additional information, a data creation part for analysis for generating data for analysis based on at least the boundary condition, and an analysis part for analyzing based on the data for analysis.

According to a second aspect of the invention, an analysis method includes acquiring shape information about an analysis target object, extracting additional information on the analysis target object from the shape information, determining at least one boundary conditions based on the additional information, generating data for analysis based on at least the boundary condition, and analyzing based on the data for analysis.

According to a third aspect of the invention, an analysis program for causing a computer to execute the function of acquiring shape information about an analysis target object, extracting additional information on the analysis target object from the shape information, determining at least one boundary conditions based on the additional information, generating data for analysis based on at least the boundary condition and analyzing based on the data for analysis.

According to a fourth aspect of the invention, a computer readable record medium recording an analysis program for causing a computer to execute the function of acquiring shape information about an analysis target object, extracting additional information on the analysis target object from the shape information, determining at least one boundary conditions based on the additional information, generating data for analysis based on at least the boundary condition and analyzing based on the data for analysis.

BRIEF DESCRIPTION OF THE DRAWINGS

FIG. 9 is a flowchart describing an operation of the analysis apparatus.

DETAILED DESCRIPTION OF THE PREFERRED EMBODIMENTS

An embodiment of an analysis apparatus according to the invention will be described below with reference to the drawings.

Figure 1:
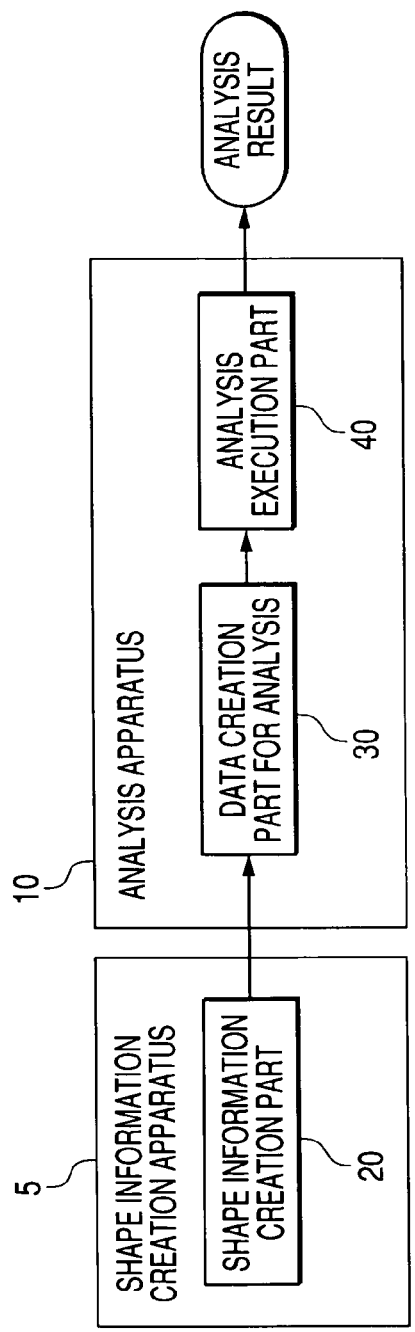
FIG. 1 is a block diagram showing an embodiment of an analysis of the invention.

FIG. 1 is a block diagram showing an embodiment of an analysis apparatus according to the invention.

An analysis apparatus 10 of the present embodiment is used for analyzing for supporting various processes of product development, and is, for example, an apparatus for analyzing various physical characteristics of an analysis target object having a desired shape by simulation.

The analysis apparatus 10 includes a data creation part 30 for analysis for creating data for analysis with respect to shape information which is two-dimensional shape information or three-dimensional shape information about an analysis target object created by a shape information creation apparatus 5, and an analysis execution part 40 which is an analysis part for executing an analysis based on the data for analysis created by the data creation part 30 for analysis. This analysis apparatus 10 is, for example, a computer apparatus. This computer apparatus executes an analysis program recorded on a record medium and thereby, the data creation part 30 for analysis and the analysis execution part 40 are configured inside the computer apparatus.

First, the shape information creation apparatus 5 will be described.

The shape information creation apparatus 5 has a shape information creation part 20 for creating two-dimensional shape information or three-dimensional shape information about an analysis target object. This shape information creation apparatus 5 is, for example, a computer apparatus. This computer apparatus executes a shape information creation program recorded on the record medium and thereby, the shape information creation part 20 is configured inside the computer apparatus.

The shape information creation part 20 is provided with a basic shape information storage part and an additional information storage part.

The basic shape information storage part has a basic shape used as a basis for representing a shape of the analysis target object. The shape information about the analysis target object is formed as two-dimensional shape information or three-dimensional shape information by combining a plurality of the basic shape. The basic shape includes, for example, a point, a straight line, a curve, a circle, an ellipse, a quadrilateral, a surface, etc.

The additional information storage part stores additional information added to the shape information about the analysis target object. This additional information includes, for example, pattern information, color information, etc. given to the analysis target object. This additional information does not have an influence on shape characteristics which the analysis target object has at all, and specifies a region of a point, a line, a surface, a coordinate system, etc. on the analysis target object.

The shape information creation part 20 creates shape information about the analysis target object having an arbitrary shape to which additional information is added based on information inputted through an input device such as a mouse or a keyboard while a user refers to a display part such as a display (not shown) using these basic shape information storage part and additional information storage part.

Next, the data creation part 30 for analysis of the analysis apparatus 10 will be described.

Figure 2:
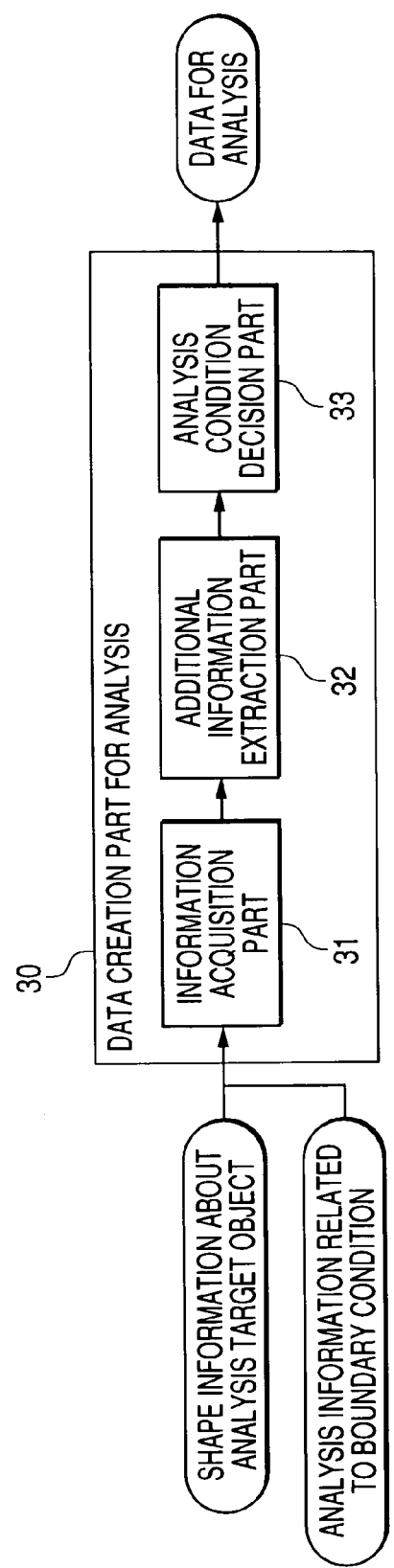
FIG. 2 is a block diagram describing details of a data creation part for analysis.

FIG. 2 is a block diagram describing details of the data creation part 30 for analysis.

The data creation part 30 for analysis comprises an information acquisition part 31, an additional information extraction part 32 and an analysis condition decision part 33.

The information acquisition part 31 acquires shape information about an analysis target object and analysis information related to a boundary condition at the time of executing simulation. Here, the analysis information refers to, for example, a parameter related to the boundary condition, a size of a mesh at the time of executing analysis, a kind of material of the shape information, etc.

The information acquisition part 31 performs display for prompting a user to input the shape information and the analysis information on, for example, a display part (not shown) etc. The user inputs necessary analysis information according to the display of this display part etc. and thereby, the information acquisition part 31 acquires the analysis information and the shape information about the analysis target object. Incidentally, in the case etc. of analyzing a shape condition prepared previously, analysis information set as a specified value can also be used. In this case, it is unnecessary to input the analysis information.

The additional information extraction part 32 extracts additional information on the analysis target object from the shape information acquired by the information acquisition part 31. Then, the analysis condition decision part 33 determines at least one boundary conditions for analyzing of the analysis target object and creates data for analysis based on the additional information extracted by the additional information extraction part 32, more specifically, based on the additional information extracted by the additional information extraction part 32 and the analysis information acquired by the information acquisition part 31.

The additional information extraction part 32 extracts additional information such as pattern information or color information attached to the shape information about the analysis target object, and identifies the contents of a region to which the additional information is attached and its kind. Then, the analysis condition decision part 33 selects a boundary condition corresponding to this extracted additional information, and sets the boundary condition in a place to which the additional information is attached.

Here, the analysis condition decision part 33 has, for example, a table etc. showing kinds of the boundary condition according to kinds of the additional information previously. A kind of the boundary condition is selected by referring to this table. Then, with respect to the kind of the boundary condition selected, a specific parameter is set in a region to which the additional information on the shape information is attached based on the analysis information acquired by the information acquisition part 31 and thereby, the final boundary condition is determined and data for analysis is created.

Here, the kinds of the boundary condition include, for example, a load, constraint, temperature constraint, contact, friction, thermal conductivity, emissivity, acceleration, pressure, a heat source, translation, rotation, degree of freedom, displacement constraint, etc.

The above is description of the data creation part 30 for analysis.

Next, the analysis execution part 40 of the analysis apparatus 10 will be described.

The analysis execution part 40 executes various simulation with respect to the analysis target object based on data for analysis created by the data creation part 30 for analysis. Specifically, various simulation can be executed according to the boundary condition and, for example, stress analysis, strength analysis, vibration analysis, thermal conduction analysis of the analysis target object. The analysis execution part 40 performs an output of a simulation result used as an analysis result to a display part (not shown), preservation of result data to a record medium, etc. and ends.

According to the embodiment as described above, a kind of the boundary condition and a region to which the boundary condition is attached can be identified based on the additional information added to the shape information of the analysis target object. Therefore, at the time of setting the boundary condition, time and effort in which a region is identified and a specific parameter is set are saved and thereby, the number of man-hours of work decreases and the boundary condition can be set easily.

According to the embodiment, the additional information is color information, pattern information, etc. added to the shape information about the analysis target object, so that the additional information can be added by simple work at the time of creating the shape information about the analysis target object.

In the above description, the case that the analysis apparatus 10 obtains the shape information created by the shape information creation apparatus 5 has been described, but it is not limited to this. For example, it may be configured so that the shape information creation part 20 of the shape information creation apparatus 5 is incorporated into the analysis apparatus 10 and shape information with additional information on an analysis target object is created and a kind of a boundary condition and a region of the additional information added to the shape information are identified using this shape information.

According to the embodiment, the additional information is general information such as color information or pattern information, so that the shape information about the analysis target object can be created by arbitrary software and a region to which a boundary condition is attached can be identified by reading the created shape information with the additional information on the analysis target object. Therefore, degree of freedom of creation of the analysis target object increases and the shape information created by various shape creation software can be analyzed. Also, data resources created by another software can be used and general versatility of data improves.

EXAMPLE

An example of an analysis apparatus according to the invention will be described below with reference to the drawings.

Figure 3:
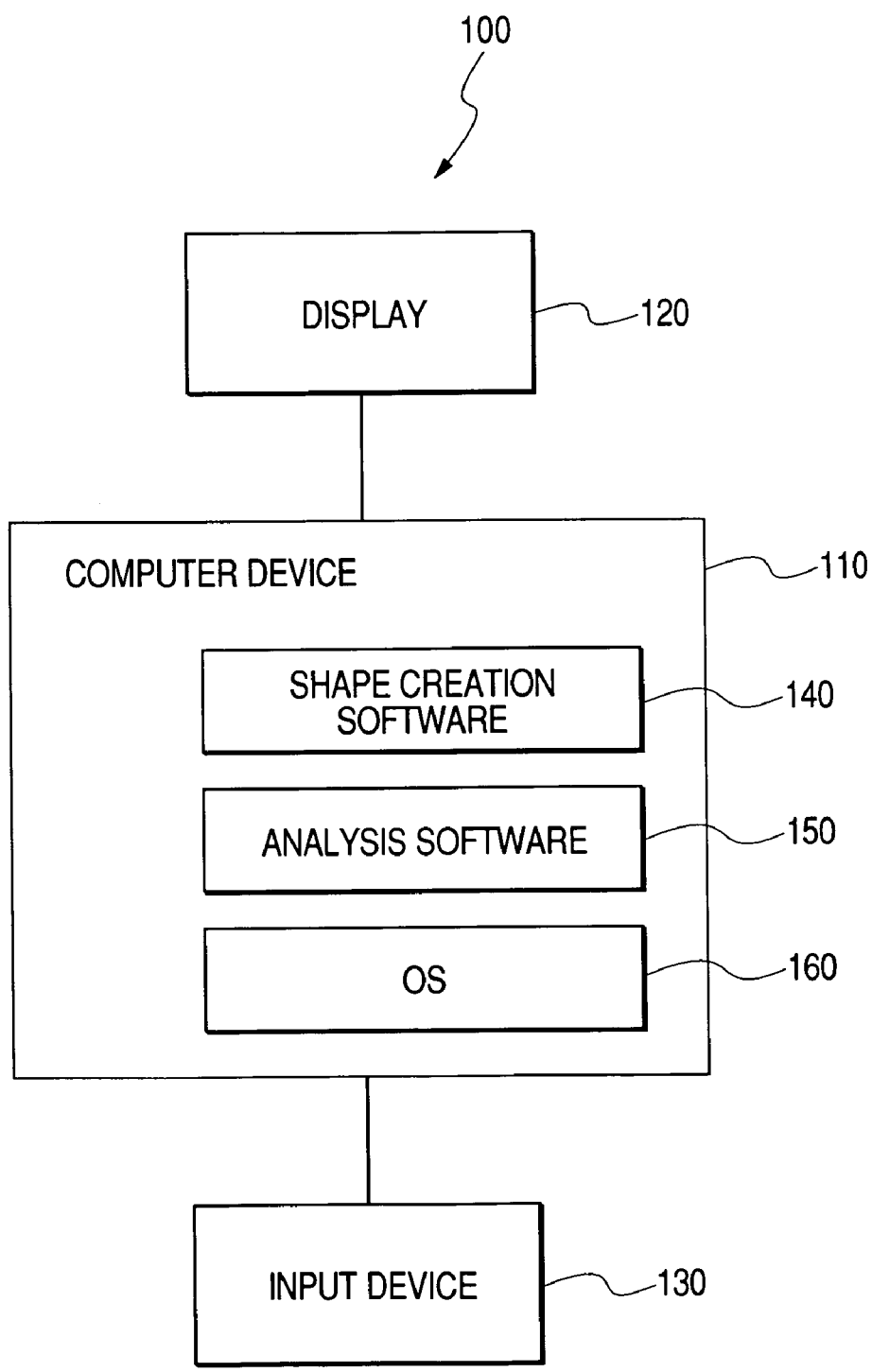
FIG. 3 is a block diagram showing a schematic configuration of an analysis apparatus 100 of an example according to the invention.

FIG. 3 is a block diagram showing a schematic configuration of an analysis apparatus 100 of the present example.

The analysis apparatus 100 of the example is used for making various simulation analyses for supporting various processes of product development, and is an apparatus for performing structural analysis simulation of an analysis target object based on object data which is shape information about the analysis target object having a desired shape created by shape creation software such as CAD (Computer Aided Design) application software or a shape creation function of the analysis apparatus itself.

As shown in FIG. 3, the analysis apparatus 100 is configured to have a computer device 110, a display 120 acting as a display part, and an input device 130 comprising a keyboard, a mouse, etc. for doing an information input to the computer 110.

Shape creation software 140, analysis software 150 and an OS (Operation System) 160 are installed on the computer device 110. The computer device 110 is configured so that the display 120 and the input device 130 can be controlled by activating and executing the OS 160.

The shape creation software 140 is CAD application software etc. operating on the OS 160 and makes the computer device 110 function as a shape creation device.

In a manner similar to the shape creation software, the analysis software 150 is CAE application software operating on the OS 160 and makes the computer device 110 function as an analysis device of simulation execution.

Each the software 140, 150 will specifically be described below.

First, the shape creation software 140 will be described with reference to FIG. 4.

Figure 4:
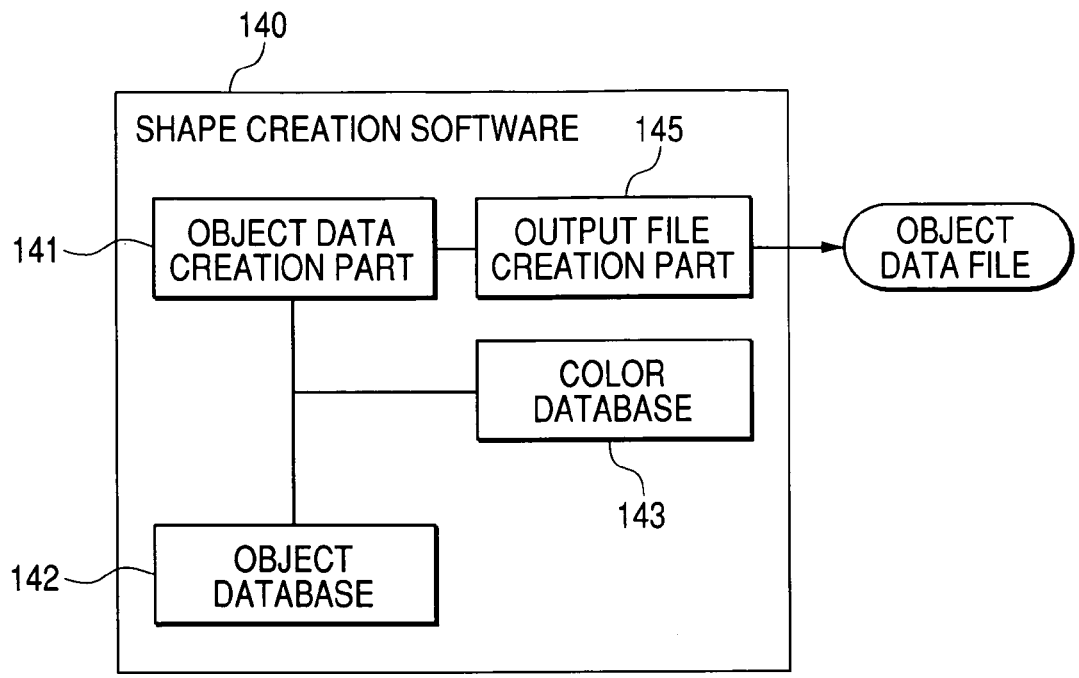
FIG. 4 is a block diagram showing a functional configuration of shape creation software.

FIG. 4 is a block diagram showing a functional configuration of the shape creation software 140.

As shown in FIG. 4, the shape creation software 140 is executed by the computer device 110 and thereby, an object data creation part 141, an object database 142, a color database 143 and an output file creation part 145 are made to function on the computer device 110.

The object data creation part 141 is a portion for forming essence of the shape creation software 140, and selects a basic object constituting an object from the object database 142 by a user and creates object data which is shape information about an analysis target object and displays the object data on the display 120.

The object database 142 has a point, a straight line, a curve, a circle, an ellipse and a quadrilateral as the basic object. These basic objects have a length, a radius, etc. as a variable, and a shape of an arbitrary size can also be represented by changing these values. While properly changing a parameter of these basic objects which the object database 142 has, the object data creation part 141 creates object data of an analysis target object having an arbitrary shape and displays the object data on the display 120.

The color database 143 has color data which is additional information added to the object data displayed on the display 120. This color data is added in order to specify a place for setting a boundary condition of a point, a line, a surface of the object data or a coordinate system etc. of the object data. The object data creation part 141 can select a desired color in the color database 143 according to instructions of a user and color a selected region of the object data. Incidentally, here, coloring of a coordinate system is used for showing a direction of action of gravity etc. applied to the whole system including the object data.

Figure 5:
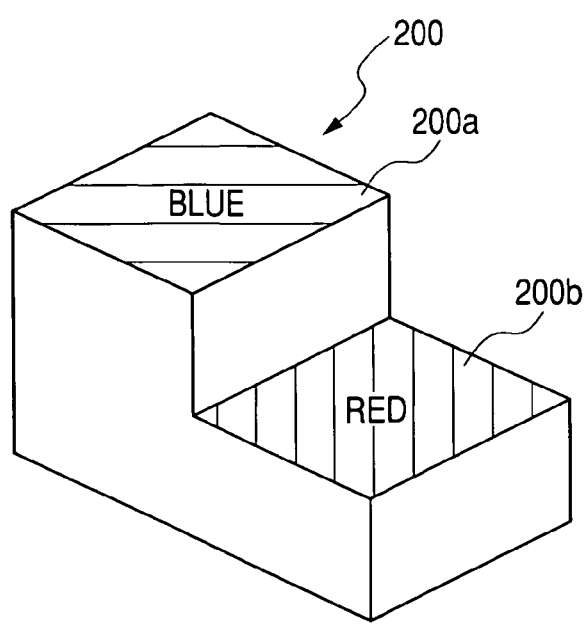
FIG. 5 shows a state of coloring object data.

FIG. 5 shows a state of coloring object data 200 created on a display actually. As shown in FIG. 5, for example, stepwise object data 200 is created by the object data creation part 141, and blue is added to a first surface 200a and red is added to a second surface 200b.

The added color data corresponds to a kind of a boundary condition at the tome of simulation execution every color. A relation between the color and the boundary condition will be described below.

Incidentally, a predetermined mark such as a pattern, a previously created icon or a thumbnail may be used as the additional information without being limited to color.

The output file creation part 145 is a file output part for outputting object data created by the object data creation part 141 in a predetermined file format. An object data file outputted from this output file creation part 145 includes additional information and shape information about an analysis target object, and has a known format such as IGES.

Next, the analysis software 150 will be described with reference to FIG. 6.

Figure 6:
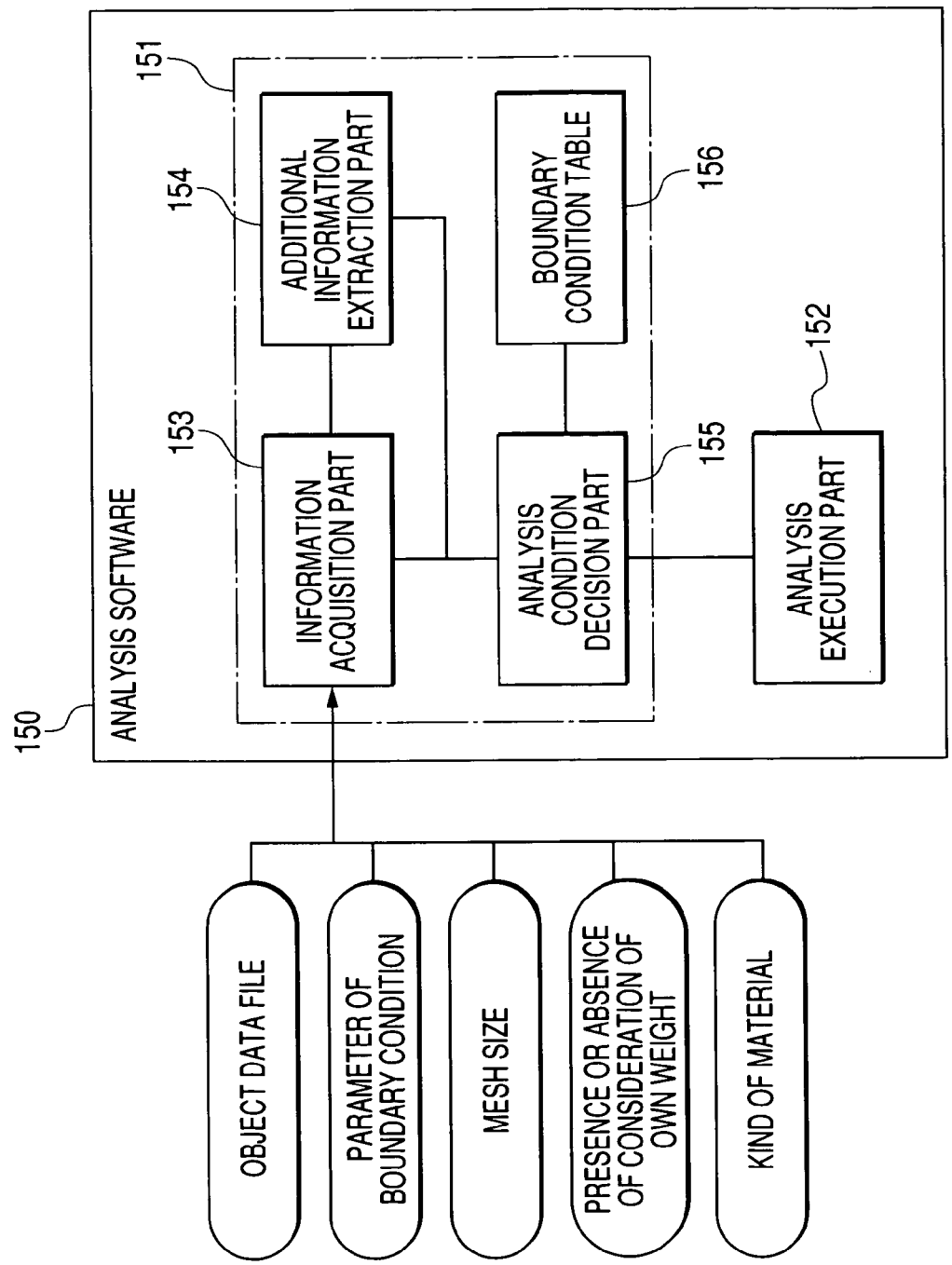
FIG. 6 is a block diagram showing a functional configuration of analysis software.

FIG. 6 is a block diagram showing a functional configuration of the analysis software 150.

The analysis software 150 is executed by the computer device 110 and thereby, a data creation part 151 for analysis for creating data for analysis and an analysis execution part 152 for making an actual simulation analysis based on the data for analysis created by the data creation part 151 for analysis are made to function on the computer device 110.

The data creation part 151 for analysis has an information acquisition part 153, an additional information extraction part 154, an analysis condition decision part 155 and a boundary condition table 156.

The information acquisition part 153 is used for acquiring various parameters etc. about simulation execution and an object data file created by the shape creation software 140. The various parameters about simulation execution refer to, for example, a size of a load, a size of a mesh in the case of performing simulation, material constructing object data, the presence or absence of consideration of own weight of object data, etc.

Figure 7:
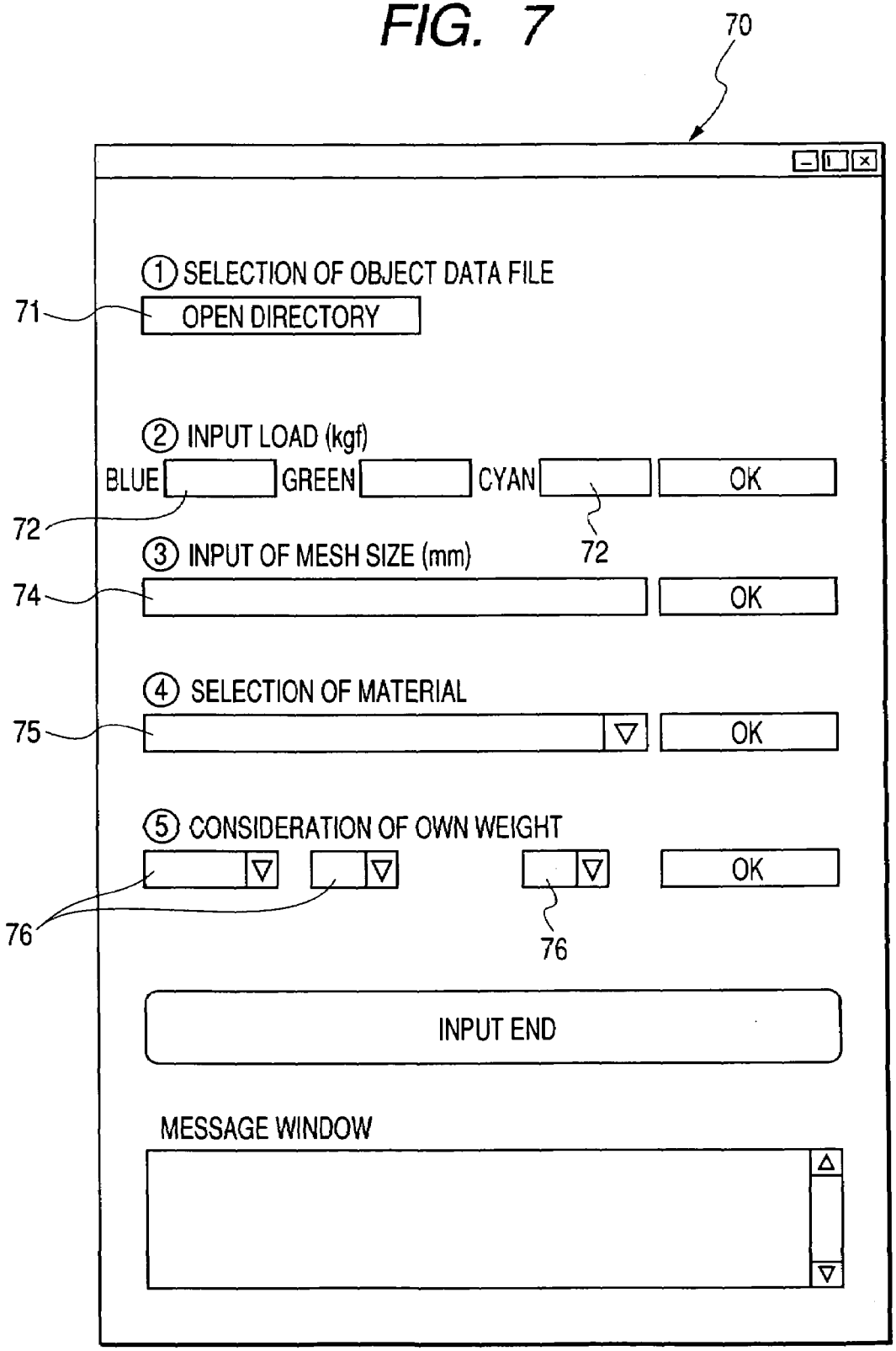
FIG. 7 is a display example of a data input screen displayed on a display.

FIG. 7 is a data input screen 70 displayed on the display 120 by the information acquisition part 153. A user inputs data to input fields 71 to 76 comprising a selection button, input space, etc. according to the data input screen 70 as shown in FIG. 7. As a result of this, in the information acquisition part 153, various parameters about simulation execution and an object data file for executing simulation are inputted through the input device 130 and each data is acquired. Incidentally, FIG. 7 shows a screen display example presumed that a load is applied as a boundary condition, but it is not limited to this, and the case of applying various kinds of boundary condition prepared in the boundary condition table is contemplated.

The additional information extraction part 154 extracts color data etc. as additional information on an analysis target object from object data in the object data file acquired by the information acquisition part 153. Then, the additional information extraction part 154 identifies the contents of a region to which each the color data is attached and its kind. In FIG. 5, it is identified that blue is attached to the first surface 200*a* of the object data 200 and red is attached to the second surface 200*b*.

Based on the attached region and the kind of color data as the additional information extracted by the additional information extraction part 154, the analysis condition decision part 155 determines a boundary condition for analyzing and creates data for analysis. This analysis condition decision part 155 determines the boundary condition while referring to the boundary condition table 156 showing kinds of boundary condition according to kinds of color data.

Specifically, in the boundary condition table 156, kinds of boundary condition are associated according to each the color data. Here, the kinds of the boundary condition include, for example, a load, constraint, temperature constraint, contact, friction, thermal conductivity, emissivity, acceleration, pressure, a heat source, translation, rotation, degree of freedom, displacement constraint, etc.

The analysis condition decision part 155 determines which kind of boundary condition each color data or pattern data indicates by referring to this boundary condition table 156. For example, "blue" colored to the first surface 200*a* shown in FIG. 5 indicates a load surface to which a load is applied. Then, "red" colored to the second surface 200*b* indicates a fixed surface for fixing the object 200 in a support body. The analysis condition decision part 155 sets a size of a load obtained by the information acquisition part 153 to the first surface 200*a*, and determines a boundary condition by setting the fact that the second surface 200*b* is the fixed surface.

The analysis condition decision part 155 sets material constituting object data acquired by the information acquisition part 153, and calculates own weight of the object data, and makes setting as to whether or not to perform processing according to the presence or absence of consideration of own weight of the object data. Also, the analysis condition decision part 155 arranges a mesh in the object data according to a size of the mesh acquired by the information acquisition part 153. Thus, the analysis condition decision part 155 sets various boundary conditions with respect to the object data and creates data for analysis for simulation execution.

The analysis execution part 152 executes actual simulation according to the boundary condition set by the analysis condition decision part 155, and displays a simulation result on the display 120. The simulation result may be constructed so as to create and retain a simulation result file.

The above is the functional description of the analysis software 150.

Figure 8:
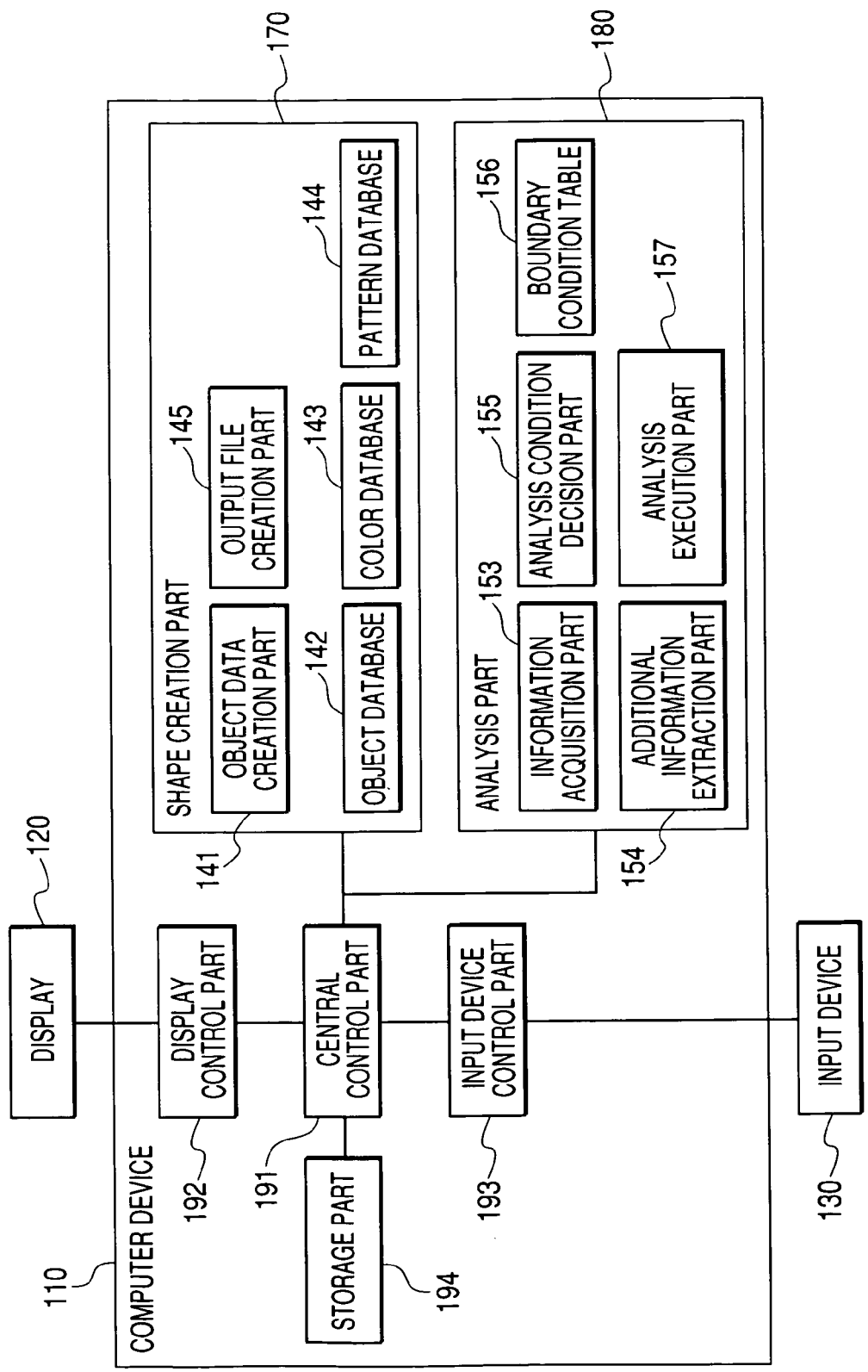
FIG. 8 is a block diagram showing a state in which shape creation software and analysis software are activated and are configured as an analysis apparatus.

FIG. 8 is a block diagram showing a state in which the shape creation software 140 and the analysis software 150 are installed and the computer device 110 is configured as the analysis apparatus 100.

The computer device 110 has a central control part 191, a display control part 192, an input device control part 193, a storage part 194, a shape creation part 170 and an analysis part 180.

The central control part 191 is used for performing a centralized control of each the part of the computer device 110 in conjunction with the storage part 194. Here, the storage part 194 may be may be capable of retaining electronic data and, for example, may be any of a hard disk drive, an optical disk, etc.

The display control part 192 performs display control of the display 120 according to instructions from the central control part 191. The input device control part 193 controls an input device such as a keyboard or a mouse according to instructions from the central control part 191.

The shape creation part 170 is configured by executing the shape creation software 140 and the analysis part 180 is configured by executing the analysis software 150. Since configurations of the shape creation part 170 and the analysis part 180 are same as the functional configurations of each the software described in FIGS. 4 and 6, description thereof is omitted.

Next, an analysis method using the analysis apparatus 100 in the present example will be described with reference to FIG. 9.

FIG. 9 is a flowchart describing an operation of the analysis apparatus 100 in the present example.

First, the computer device 110 activates the shape creation software 140 according to instructions of a user and configures the shape creation part 170 inside the computer device 110. Then, the shape creation part 170 creates object data according to an operation of the user through the object data creation part 141 and the object database 142. At this time, the object data creation part 141 is constructed so that additional information such as a predetermined color or pattern is added to a region of a point, a line, a surface, etc. of the object data created according to the operation of the user in the color database 143 (step S1).

Then, the shape creation part 170 outputs the created object data as an object data file (step S2). The created object data file is retained in the storage part 194.

Next, the computer device 110 activates the analysis software 150 and configures the analysis part 180 inside the computer device 110. Then, the analysis part 180 displays the data input screen 70 on the display 120 through the information acquisition part 153. Then, the information acquisition part 153 acquires various parameters etc. about simulation execution and an object data file specified and inputted by the user according to display of the data input screen (step S3).

Then, the additional information extraction part 154 extracts additional information added to the object data and identifies the contents of a region to which the additional information is attached and its kind (step S4). Then, the analysis condition decision part 155 refers to the boundary condition table 156 and identifies a kind of boundary condition indicated by the additional information and determines the boundary condition according to various parameters about simulation execution acquired by the information acquisition part 153. Further, the analysis condition decision part 155 refers to various parameters about simulation execution and sets own weight, material, a size of a mesh, etc. to the object data and creates data for analysis (step S5).

Then, in the data for analysis, simulation is executed by the analysis execution part 152 and results of a stress characteristic, a vibration characteristic, etc. of an object are obtained according to the contents of the simulation (step S6).

The simulation results are displayed on the display 120 or are retained in the storage part 194 as simulation result data.

The analysis by the analysis apparatus 100 is described above.

As described above, according to the analysis apparatus 100 of the present example, the analysis apparatus includes an information acquisition part 153 for acquiring object data used as shape information about an analysis target object, an additional information extraction part 154 for extracting additional information on the analysis target object from the object data, and an analysis condition decision part 155 for determining at least one boundary conditions based on the additional information.

According to the analysis apparatus 100, by acquiring additional information from object data, a region to which a boundary condition is automatically given and a kind of the boundary condition given to its region can be identified. Thus, at the time of setting the boundary condition, user's time and effort in which the region is identified and a specific parameter is set are saved and thereby, the number of man-hours of work at the time of setting the boundary condition decreases and the boundary condition necessary for simulation execution can be set easily.

According to the present example, additional information is marking of color data, pattern data, etc. added to object data of an analysis target object, so that the additional information can be added by simple work at the time of creating the object data of the analysis target object and the work is easy. Also, in the marking, a visual check by a user is easy, so that correctness or mistake of setting region selection of a boundary condition can also be checked easily.

In the present example, a kind of a boundary condition and a region to which the boundary condition is attached can be identified based on shape information with additional information on an analysis target object generated by the shape creation software 140 different from the analysis software 150. Therefore, data resources created by another software can be used and general versatility of data improves.

Incidentally, the present example has been configured so that by the analysis apparatus 100, object data is created and simulation analysis is made, but it is not limited to this. It may be configured so that using shape creation software installed on another computer device, object data is created and this object data is inputted to the analysis apparatus 100 and thereby simulation analysis is made.

What is claimed is:

1. An analysis apparatus comprising:
    an information acquisition part for acquiring object data concerning an analysis target object to which a color data is added;
    a boundary condition table in which a kind of boundary condition is corresponding in accordance with each color data;
    a color data extraction part for extracting the color data related to the analysis target object from the object data;
    an analysis condition decision part for determining at least one boundary condition by referring to the boundary condition table based on the color extracted by the color data extraction part;
    a data creation part for analysis for generating data for analysis based on at least the boundary condition; and
    an analysis part for analyzing based on the data for analysis.

2. The analysis apparatus according to claim 1, wherein the color data is given in correspondence with a surface, an edge, a point, a coordinate system and a shape of the analysis target object.

3. The analysis apparatus according to claim 1, wherein the object data is either one of two-dimensional information about the analysis target object and three dimensional information about the analysis target object.

4. An analysis method comprising:
    acquiring object data concerning shape information about an analysis target object to which a color data is added;
    a boundary condition table in which a kind of boundary condition is corresponding in accordance with each color data;
    extracting the color data related to the analysis target object from the object data;
    determining at least one boundary conditions by referring to the boundary condition table based on the color data extracted by the color data extraction part;
    generating data for analysis based on at least the boundary condition; and
    analyzing based on the data for analysis.

5. A computer readable medium recording an analysis program for causing a computer to execute the function of:
    acquiring object data concerning an analysis target object to which a color data is added;
    a boundary condition table in which a kind of boundary condition is corresponding in accordance with each color data;
    extracting the color data related to the analysis target object from the object data;
    determining at least one boundary condition by referring to the boundary condition table based on the color data extracted by the color data extraction part;
    generating data for analysis based on at least the boundary condition; and
    analyzing based on the data for analysis.

* * * * *